(12) United States Patent
Yang et al.

(10) Patent No.: US 8,339,144 B2
(45) Date of Patent: Dec. 25, 2012

(54) TEST FIXTURE FOR TESTING POSITIONING OF CONNECTOR

(75) Inventors: Guang Yang, Shenzhen (CN); Hong-Wei Ren, Shenzhen (CN)

(73) Assignees: Fu Tai Hua Industry (Shenzhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 68 days.

(21) Appl. No.: 13/110,018

(22) Filed: May 18, 2011

(65) Prior Publication Data

US 2012/0182562 A1 Jul. 19, 2012

(30) Foreign Application Priority Data

Jan. 14, 2011 (CN) .......................... 2011 1 0008131

(51) Int. Cl.
*H01H 31/04* (2006.01)
*H01H 31/02* (2006.01)

(52) U.S. Cl. .......................... 324/538; 324/754; 356/614

(58) Field of Classification Search .................. 356/614, 356/71–73; 324/538, 158.1, 754, 755, 756, 324/761, 75; 385/12, 88, 92; 250/221
See application file for complete search history.

(56) References Cited

U.S. PATENT DOCUMENTS

| | | | | |
|---|---|---|---|---|
| 4,806,855 A | * | 2/1989 | Davis | 324/127 |
| 6,124,716 A | * | 9/2000 | Kanamori | 324/538 |
| 6,157,197 A | * | 12/2000 | Iwasaki | 324/538 |
| 6,445,190 B1 | * | 9/2002 | Sato | 324/538 |
| 6,819,126 B2 | * | 11/2004 | Los et al. | 324/750.3 |
| 7,012,686 B2 | * | 3/2006 | Rogers et al. | 356/244 |
| 7,113,273 B2 | * | 9/2006 | Pahk et al. | 356/237.1 |
| 7,898,272 B2 | * | 3/2011 | Sasaki et al. | 324/756.03 |
| 2003/0126735 A1 | * | 7/2003 | Taniguchi et al. | 29/593 |
| 2004/0139605 A1 | * | 7/2004 | Inada et al. | 29/857 |
| 2006/0097714 A1 | * | 5/2006 | Machado | 324/158.1 |
| 2008/0076298 A1 | * | 3/2008 | Matsumura et al. | 439/584 |

FOREIGN PATENT DOCUMENTS

EP 0303235 A2 2/1989

* cited by examiner

*Primary Examiner* — Sang Nguyen
(74) *Attorney, Agent, or Firm* — Altis Law Group, Inc.

(57) ABSTRACT

A test fixture for testing positioning of a connector includes a support, a housing mounted on the support, a movable block received within in the housing, a power module set inside of the movable block, a conductive block mounted on the power module, a probe element aligned with the conductive block, and a light-emitting element electrically connected to the power module and the probe element. The movable block is movably mounted on the support, and includes an extending portion. When the connector is precisely positioned in a slot of an electronic device and the extending portion is inserted into the slot of the electronic device, the movable block is resisted by the connector to be driven to move such that the conductive block contacts the probe element, thereby turning on the light-emitting element.

5 Claims, 5 Drawing Sheets

TEST FIXTURE FOR TESTING POSITIONING OF CONNECTOR

BACKGROUND

1. Technical Field

The present disclosure relates to test fixtures and, particularly, to a test fixture for testing whether a connector is precisely positioned in an electronic device.

2. Description of Related Art

Connectors are often manually positioned in a receiving space of an electronic device. However, it is relatively difficult to determine whether the connector is precisely positioned in the receiving space of the electronic device.

Therefore, what is needed is a test fixture for determining whether a connector is precisely positioned to overcome the described limitations.

DETAILED DESCRIPTION

Figure 1:
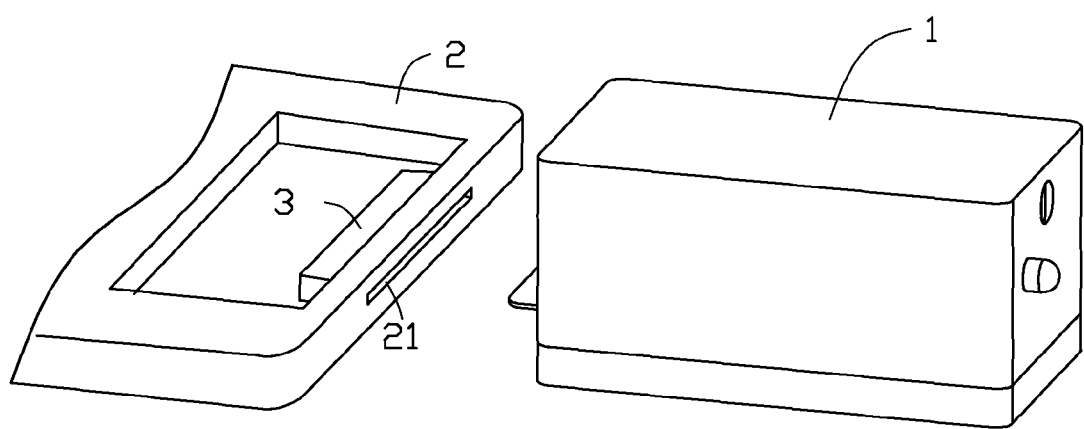
FIG. 1 is an isometric view of a test fixture for testing a position of a connector in accordance with an exemplary embodiment.
Figure 2:
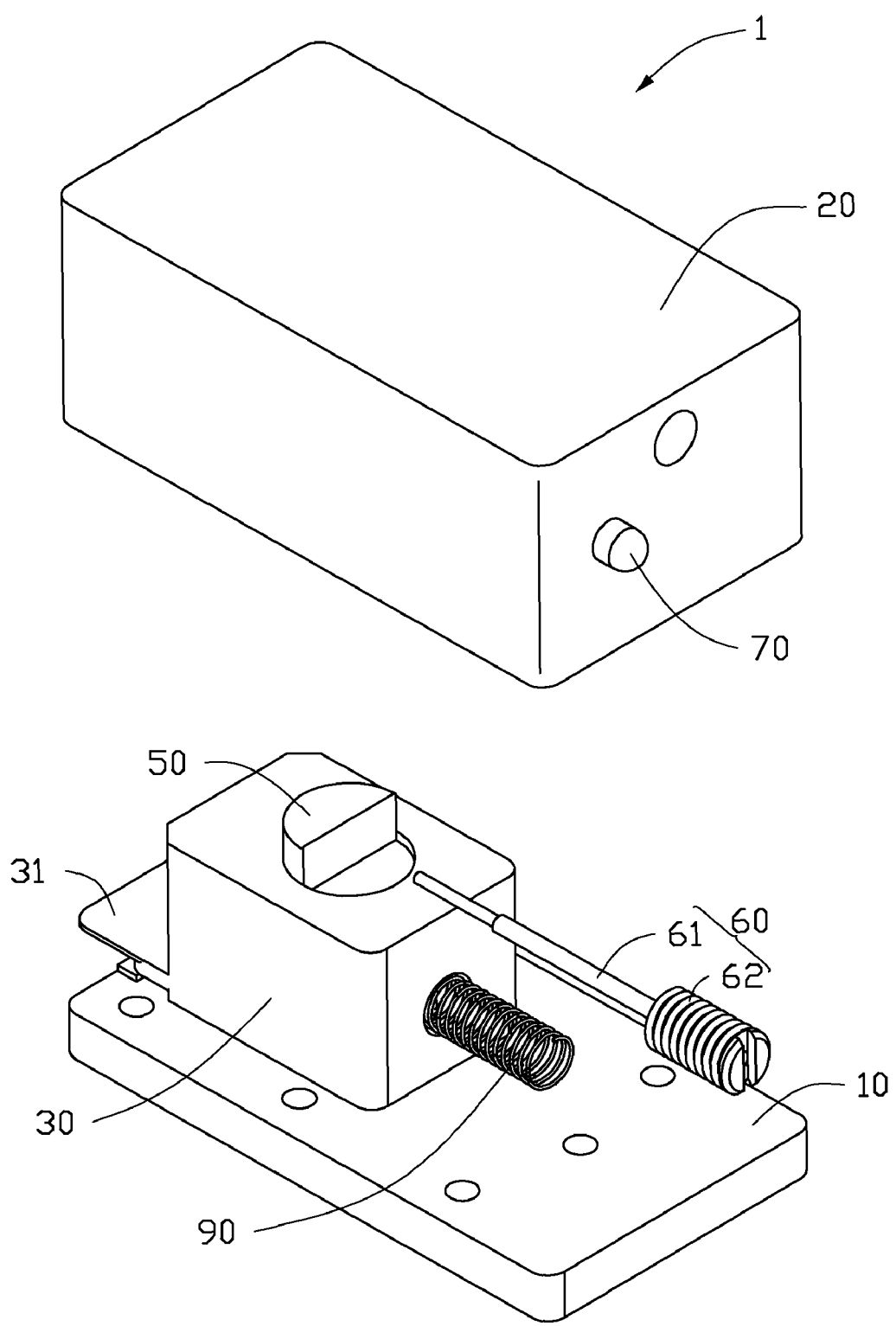
FIG. 2 is a partially exploded view of the test fixture for testing the position of the connector of FIG. 1.
Figure 3:
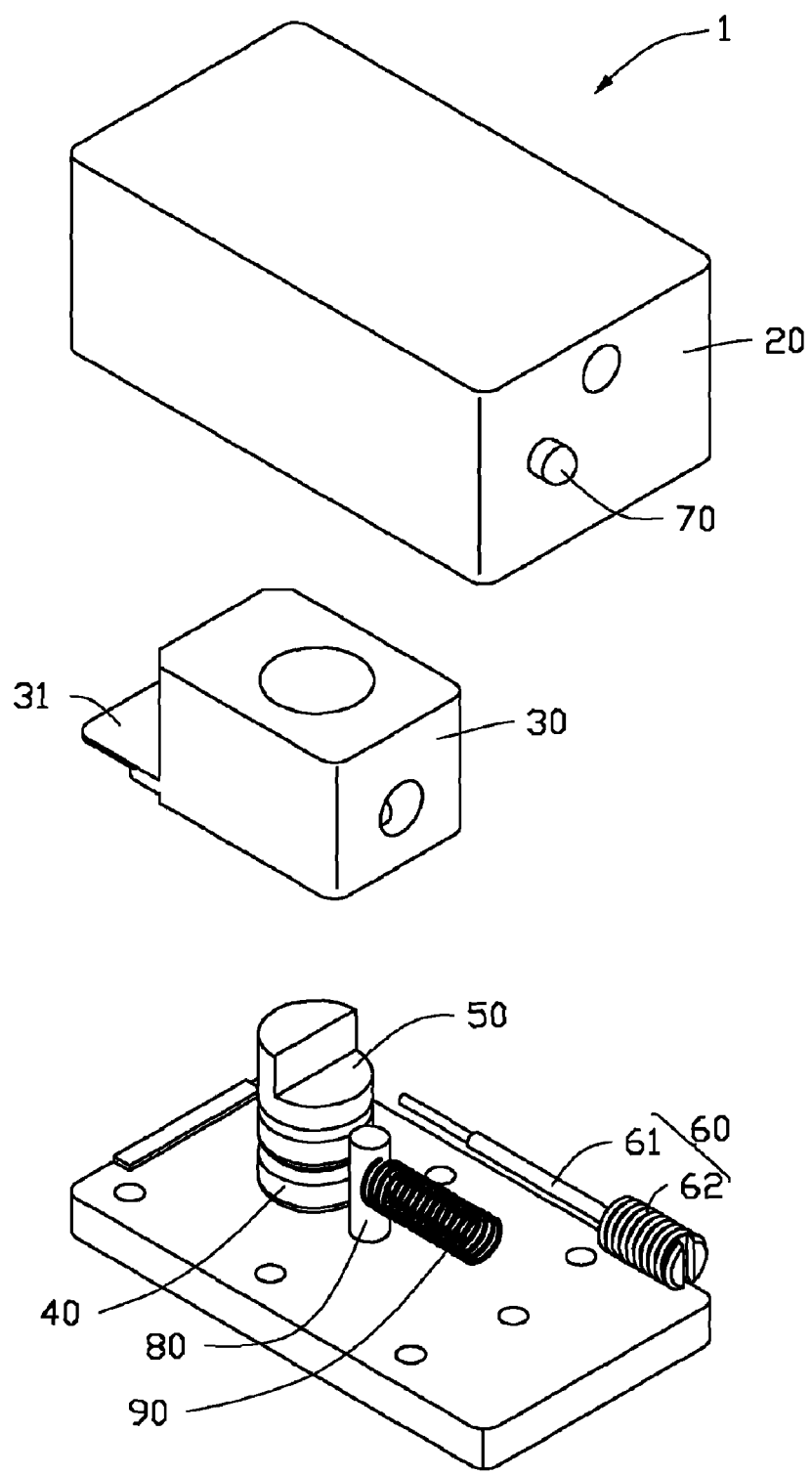
FIG. 3 is another partially exploded view of the test fixture for testing the position of the connector of FIG. 1.

Referring to FIGS. 1-3, an embodiment of a test fixture 1 is illustrated. The test fixture 1 is used to be inserted into a slot 21 of a sidewall of an electronic device 2 to test whether a connector 3 is precisely positioned in the slot 21 of the electronic device 2. The test fixture 1 includes a support 10, a housing 20 mounted on the support 10, a movable block 30 movably placed on the support 10 and within the housing 20, a power module 40 within the movable block 30, and a conductive block 50 mounted on the power module 40.

The test fixture 1 further includes a probe element 60 aligned with the conductive block 50, and a light-emitting element 70 electrically connected to the power module 40 and the probe element 60.

Figure 5:
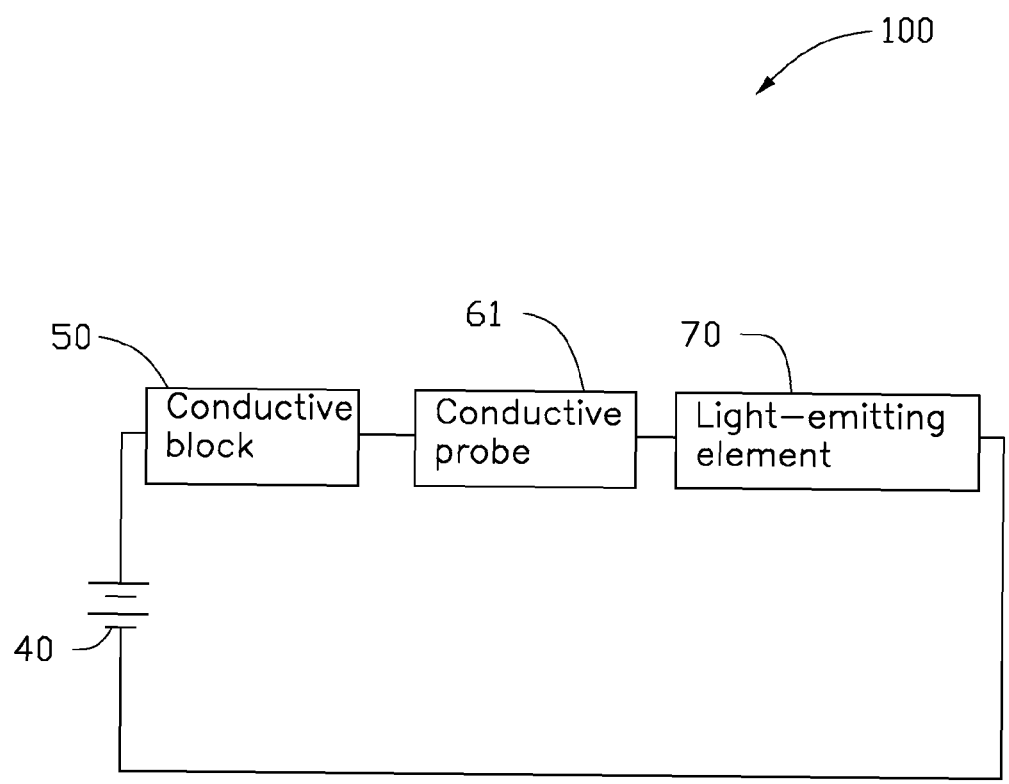
FIG. 5 is a circuit diagram of the test fixture of FIG. 1.

To test whether the connector 3 is precisely positioned in the electronic device 2, the movable block 30 is inserted into the slot 21 by an external force. When the connector 3 is precisely positioned in the electronic device 2, the movable block 30 is resisted by the connector 3 to move until the conductive block 50 contacts the probe element 60, thereby closing a circuit 100 (as shown in FIG. 5) of the light-emitting element 70, and turning on the light-emitting element 70 to indicate that the connector 3 is precisely positioned in the electronic device 2. In order to better understand the disclosure, an exemplary embodiment is described in detail.

The movable block 30 includes an extending portion 31 extending from one side thereof. The extending portion 31 can be driven by the movable block 30 to be inserted into the slot 21.

The probe element 60 includes a conductive probe 61 and an adjusting portion 62. The adjusting portion 62 is configured for adjusting a distance between the conductive probe 61 and the conductive block 50. One end of the light-emitting element 70 is electrically connected to the power module 40, and the opposite end is electrically connected to the conductive probe 61.

The test fixture 1 further includes a limiting post 80 and an elastic element 90. The limiting post 80 is set inside of the movable block 30. One end of the elastic element 90 is connected to the limiting post 80, and the opposite end is connected to a sidewall of the housing 20 away from the extended portion 31. During testing when the extending portion 31 is inserted into the slot 21, the movable block 30 can be moved by the connector 3, if the connector 3 is precisely positioned, and the elastic element 90 will be deformed by the limiting post 80. When the extending portion 31 is removed from the slot 21, the elastic element 90 will rebound to drive the movable block 30 to return to an original position. In one embodiment, the elastic element 90 is a spring.

Figure 4:
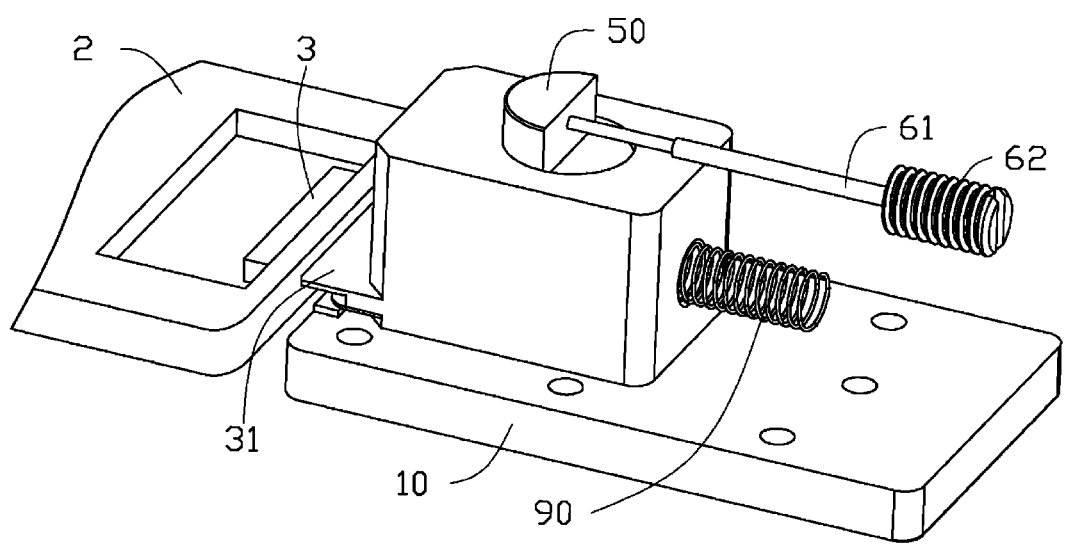
FIG. 4 shows the test fixture in a working state.

Referring to FIGS. 4-5, to test whether the connector 3 is precisely positioned, the extending portion 31 is inserted into the slot 21. If the connector 3 is precisely positioned in the electronic device 2, the extending portion 31 will be moved by the connector 3, thereby moving the movable block 30, the power module 40, and the limiting post 80 to deform the elastic element 90. The conductive block 50 is driven by the movable block 30 to move towards the conductive probe 61 until it contacts the conductive probe 61. When the conductive block 30 contacts the conductive probe 61, the circuit 100 is closed turning on the light-emitting element 70 to indicate that the connector 3 is precisely positioned. Otherwise, if the light-emitting element 70 does not turn on, the connector 3 is determined as not precisely positioned.

After the test fixture 1 tests that the connector 3 is precisely positioned in the electronic device 2, the extending portion 31 is removed from the slot 21 of the electronic device 2. After the extending portion 31 is removed from the slot 21, the elastic element 90 rebounds to drive the movable block 30 to return to the original position.

Although the present disclosure has been specifically described on the basis of the exemplary embodiment thereof, the disclosure is not to be construed as being limited thereto. Various changes or modifications may be made to the embodiment without departing from the scope and spirit of the disclosure.

What is claimed is:

1. A test fixture for testing positioning of a connector, comprising:

a support;

a housing mounted on the support;

a movable block received within in the housing, and movably mounted on the support, the movable block comprising an extending portion;

a power module set inside of the movable block;

a conductive block mounted on the power module;

a probe element aligned with the conductive block, and comprising a conductive probe and an adjusting portion, wherein the adjusting portion is configured to adjust a distance between the conductive probe and the conductive block; and a light-emitting element electrically connected to the power module and the conductive probe of the probe element;

wherein when the connector is precisely positioned in a slot of an electronic device, and the extending portion is inserted into the slot of the electronic device, the movable block is resisted by the connector to be driven to move such that the conductive block contacts the probe element, thereby turning on the light-emitting element.

2. The test fixture as described in claim 1, wherein the light-emitting element is a LED.

3. The test fixture as described in claim 1, further comprising:
- a limiting post set inside of the movable block;
- an elastic element, wherein one end of the elastic element is connected to the limiting post, and another end is connected to a sidewall of the housing away from the connector;
- wherein when the extending portion is inserted into the slot, and the movable block is moved by the connector when the connector is precisely positioned, the elastic element is deformed by the limiting post, when the extending portion is removed from the slot, the elastic element rebounds to drive the movable block to return to an original position.

4. The test fixture as described in claim 3, wherein the elastic element is a spring.

5. The test fixture as described in claim 1, wherein a size of the extending portion whose size matches that of the slot of the electronic device, the extending portion is driven by the movable block to be inserted into the slot.

* * * * *